United States Patent [19]

Kato et al.

[11] Patent Number: 4,618,814

[45] Date of Patent: Oct. 21, 1986

[54] VOLTAGE-TO-CURRENT CONVERTER CIRCUIT

[75] Inventors: Kazuo Kato, Ibaraki; Hideo Sato, Hitachi, both of Japan

[73] Assignee: Hitachi, Ltd., Tokyo, Japan

[21] Appl. No.: 622,159

[22] Filed: Jun. 19, 1984

[30] Foreign Application Priority Data

Jun. 20, 1983 [JP] Japan ............................ 58-110668

[51] Int. Cl.[4] .............................................. G05F 1/44
[52] U.S. Cl. ...................................... 323/280; 323/281;
330/75; 307/353; 363/73
[58] Field of Search ............... 323/280, 281, 273, 275;
363/73; 307/350, 530, 352, 353; 330/75, 82, 90, 93, 112

[56] References Cited

U.S. PATENT DOCUMENTS

| | | | |
|---|---|---|---|
| 3,546,564 | 12/1970 | Denny | 323/280 |
| 3,654,545 | 4/1972 | Demark | 323/275 X |
| 3,838,346 | 9/1974 | Cox | 307/353 X |
| 4,048,525 | 9/1977 | Goldberg et al. | 307/353 |
| 4,367,437 | 1/1983 | Mikami | 323/281 X |
| 4,370,571 | 1/1983 | Andow et al. | 307/353 |
| 4,451,779 | 5/1984 | Griep | 323/280 X |

*Primary Examiner*—Philip H. Leung
*Attorney, Agent, or Firm*—Antonelli, Terry & Wands

[57] ABSTRACT

A voltage-to-current converter circuit for outputting a current accurately proportional to the input signal voltage, which converter circuit includes an operational amplifier for providing an output corresponding to a difference between the input signal and a feedback signal, and includes a feedback circuit for detecting the output current in the form of a voltage by making the output current flow through the reference resistor and for feeding back the detected voltage. Further, the feedback circuit includes a polarity inverting circuit which holds the voltage detected by the reference resistor and inverts the polarity of the voltage, and then feeds back to the operational amplifier.

13 Claims, 10 Drawing Figures

VOLTAGE-TO-CURRENT CONVERTER CIRCUIT

BACKGROUND OF THE INVENTION

1. Field of the Invention

The present invention relates to a voltage-to-current converter circuit, and in particular, relates to a voltage-to-current converter circuit suitable for high precision two-wire current signal transmission.

2. Description of the Prior Art

Generally, a voltage-to-current converter circuit is used in the ouput section of a two-wire analog signal transmission system of industrial instruments or the like. FIG. 1 is a characteristic chart showing the characteristics of output current I versus input voltage V of such a voltage-to-current converter circuit. Such a voltage-to-current converter circuit, as shown by a characteristic curve 100, is designed to convert a voltage signal between input voltages $V_1$ and $V_2$ to an output current between $I_1$ and $I_2$, and for example, a certain input voltage $V_1$ is accurately converted to an output current $I_1$, for example of 4 mA, and a voltage $V_2$ is also converted to a current $I_2$, for example of 20 mA. Further, a characteristic curve 200 shows a current which is required to operate the voltage-to-current converter circuit, and this current flows in the converter circuit besides the output current I. It is necessary for the voltage-to-current converter circuit, to make this operation current necessary for circuit operation as small as possible and to make the operation current scarcely affect the input voltage versus output current characteristics as shown by the curve 100 even when the operation current varies.

FIG. 2 is a circuit diagram of a voltage-to-current converter circuit known in the art. In the voltage-to-current converter circuit shown in FIG. 2, an input voltage $V_i$ applied to a terminal 2 is level shifted by a level shift circuit 6 connected between the terminal 2 an the negative pole of a power supply 4, and then inputted to an amplifying circuit 8. The amplifying circuit 8 is arranged to supply to a load 10 with a current corresponding to a difference between an input signal voltage $V_{iL}$ and a feedback signal voltage $V_R$. The current flowing the load 10 is detected by a feedback circuit 14 including a reference resistor 12, and fed back to the amplifying circuit 8 as a feedback signal voltage $V_R$. Thus, the voltage-to-current converter circuit supplies through the load 10 with a current proportional to the input voltage $V_i$. The level shift circuit 6 includes a resistor 61 of a resistance value $R_1$ and a resistor 62 of a resistance value $R_2$ connected in series, and the input voltage $V_i$ voltage divided by the resistors 61 and 62 is supplied to the amplifying circuit 8. The amplifying circuit 8 is comprised of an operational amplifier 81 and a transistor 82, in which the operational amplifier 81 introduces a difference between the input signal voltage $V_{iL}$ and the feedback signal voltage $V_R$ and amplifies the difference as a differential amplifier. The transistor 82 on the other hand, controls a current from the power supply 4 in accordance with the output signal from the operational amplifier 81. The positive pole of the power supply 4 is connected to the collector of the transistor 82 and to the power supply terminal of the operational amplifier 81 via a load 10. Furthermore, the emitter of the transistor 82 is connected to the negative pole of the power supply 4 via the reference resistor 12, and the emitter is also connected to ground. The negative power supply terminal of the operational amplifier 81 is connected to the negative pole of the power supply 4.

The voltage-to-current converter circuit arranged as described above operates in the following manner. The current output from the current output transistor 82 is detected as a voltage drop across the reference resistor 12 provided on the emitter side of the transistor 82. The voltage across the resistor 12 is inputted to the non-inverting input of the amplifier 81 via the resistor 62 of the level shift circuit 6. The input voltage $V_i$ applied to the terminal 2 is also inputted to the non-inverting input of the transistor 81 via the resistor 61. The amplifier circuit 81 controls the flow of current through the load 10 so that a current corresponding to a difference between the input signal voltage $V_i$ and the feedback signal voltage (substantially same with the voltage drop of the reference resistor 12) $V_R$ flows. In other words, in the operational amplifier 81, the difference between the input signal voltage $V_i$ and the feedback signal voltage $V_R$ is detected and the difference is amplified thereby to supply the amplified output to the base of the transistor 82. In accordance with the control signal applied to the base of the transistor 82, a current $I_0$ corresponding to the input signal voltage $V_i$ flows through the load 10 and the reference resistor 12.

The output current characteristics of the voltage-to-current converter circuit described above is expressed by:

$$I_0 = \frac{R_2}{R_1} \cdot \frac{V_i}{R_0} + I_{CC} \quad (1)$$

where $R_0$ is the resistance value of the reference resistor 12, $R_1$ and $R_2$ are respectively resistance values of the resistors 61 and 62, $I_0$ is the output load current, $V_1$ is the input signal voltage, and $I_{CC}$ is the operation current (which flows in and out through the power supply terminals of the operational amplifier) of the operational amplifier.

As will be apparent from the equation (1), in the voltage-to-current converter circuit of FIG. 2, since the operation current $I_{CC}$ of the operational amplifier 81 does not flow the reference resistor 12, the $I_{CC}$ component is not detected by the feedback circuit 14 and hence it causes an error in the input voltage versus output current characteristics. In addition, the value of the operation current $I_{CC}$ is usually, of the order of mA, and it is not negligible as compared with the value of the output current (maximum several tens mA). Furthermore, in the prior art converter circuit, since precision resistors must be used for the resistors $R_1$, $R_2$ and reference resistor $R_0$, there is the drawback that many expensive precision resistors are required.

In order to eliminate such a drawback, a voltage-to-current converter circuit as shown in FIG. 3 was devised. In FIG. 3, like reference characters are used for like constituent elements as in FIG. 1, and descriptions thereof are omitted. The basic difference in the arrangement of FIG. 3 with respect to that of FIG. 2 resides in that the entire current flowing from the power supply 4 through the amplifying circuit 8 is made to pass through the reference resistor 12. For this purpose the position of the reference resistor 12 differs from that in FIG. 2. In order to obtain still a sufficient operation margin of the operational amplifier 81 irrespective of the change in the position of the reference resistor 12, an output compensating circuit 16 is connected between the emitter of the output transistor 82 of the amplifying circuit 8 and the reference resistor 12, and further an input compensating circuit 18 is provided on the input side of the amplifying circuit 8. The output compensating circuit 16 includes a zener diode $ZD_1$ connected between the reference resistor 12 and the emitter of the output transistor 82. Furthermore, the circuit arrangement of FIG. 3 is so designed that the entire current including a current flowing the output transistor 82, a power supply current to the error amplifier (operational amplifier) and a current flowing through a series circuit of a resistor 183 and a zener diode $ZD_2$, that is, the load current $I_0$ flows the reference resistor 12. Such a circuit arrangement has been publicly known, for example, from U.S. Pat. No. 3,654,545 issued Apr. 4, 1972 to Anthony M. Demark, entitled "Semiconductor Strain Gauge Amplifier", in which a basically similar circuit arrangement is disclosed.

In addition, the input compensating circuit 18 voltage divides the feedback signal voltage $V_R$ from the feedback circuit 14 by resistors 181 and 182 to apply the divided voltage to the non-inverting input terminal of the operational amplifier 81 of the amplifying circuit 8, and also voltage divides the input voltage $V_i$ by the level shift circuit 6 to apply the divided voltage to the inverting input terminal of the operational amplifier 81. Furthermore, the input terminal of the resistor 182 for the input signal $V_i$ is connected to the cathode of the zener diode $ZD_2$ and this junction point is connected to the collector of the transistor 82 via a resistor 183, and the anode of the zener diode $ZD_2$, one of the power supply terminals of the operational amplifier 81 and the anode of the zener diode $ZD_1$ whose cathode connected to the emitter of the output transistor 82 are connected in common to ground.

The input output characteristics of such a voltage-to-current converter circuit is expressed by the following equation:

$$I_0 = \frac{1}{R_0(R_2 - 1)} \{k_1 V_i + (k_1 - k_2)V_z\} \quad (2)$$

where $k_1$ is the ratio $$\frac{R_{62}}{R_{61} + R_{62}},$$

$k_2$ is the ratio $$\frac{R_{181}}{R_{182} + R_{181}},$$

and $V_z$ is the voltage of the zener diode $ZD_2$. According to this voltage-to-current converter circuit, since the entire current flowing through the load 10 also flows through the resistor 12, the operation current $I_{cc}$ of the amplifier 81 does not appear as an error. However, since the precision of the output current are dependent on the precision of $k_1$ or $k_2$ of the voltage dividing resistors, it was difficult to improve the precision and to reduce the costs.

SUMMARY OF THE INVENTION

The object of the present invention is to overcome the drawbacks of the prior art mentioned in the foregoing, that is, to eliminate the error due to the operation current of the operating amplifier and to reduce the number of the high precision resistors, and thus to provide a voltage-to-current converter circuit which has a high precision but is manufactured in low costs.

To achieve the above-mentioned object, the present invention is characterized in that a voltage drop caused by a load current flowing through a reference resistor is sampled and held, and the voltage drop is supplied as a feedback signal when a difference between the input signal voltage and the feedback signal voltage is to be obtained.

DESCRIPTION OF THE PREFERRED EMBODIMENTS

Figure 1:
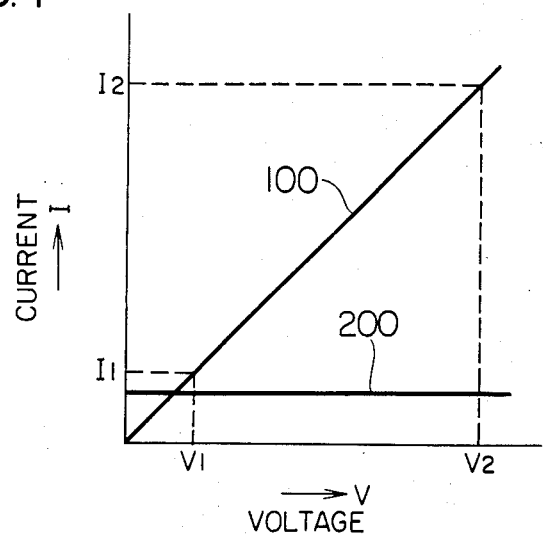
FIG. 1 is a characteristic chart useful to explain the input versus output characteristics of a voltage-to-current converter circuit.
Figure 2:
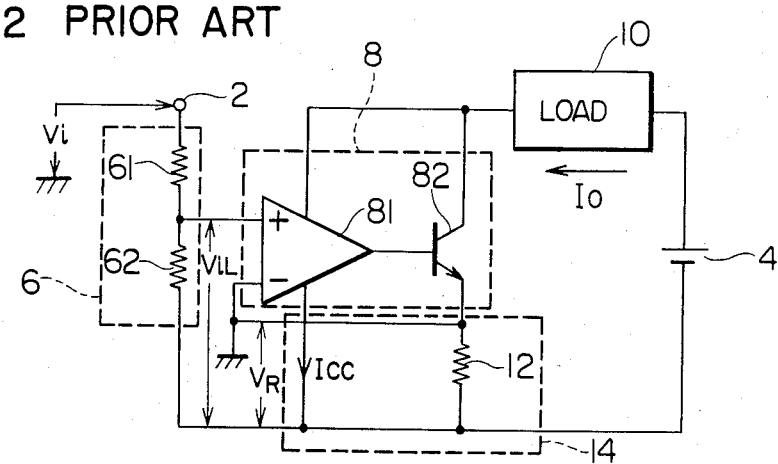
FIGS. 2 and 3 are respectively circuit diagrams illustrating prior art voltage-to-current converter circuits.
Figure 3:
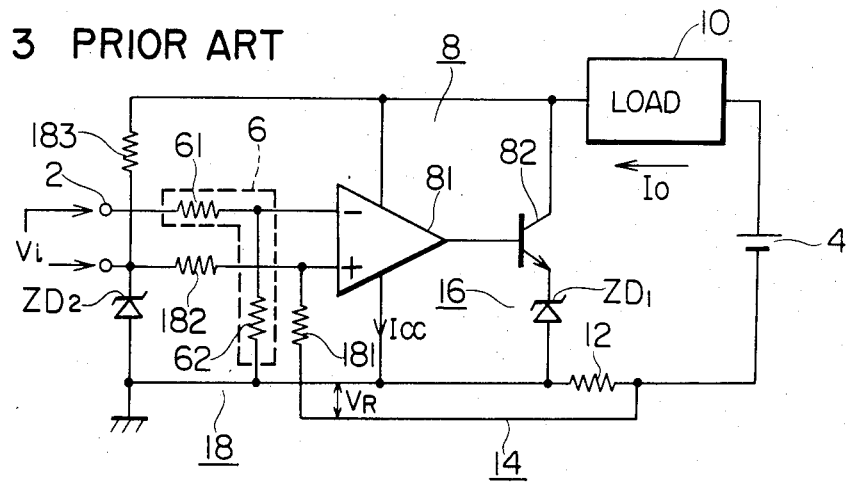
Figure 4:
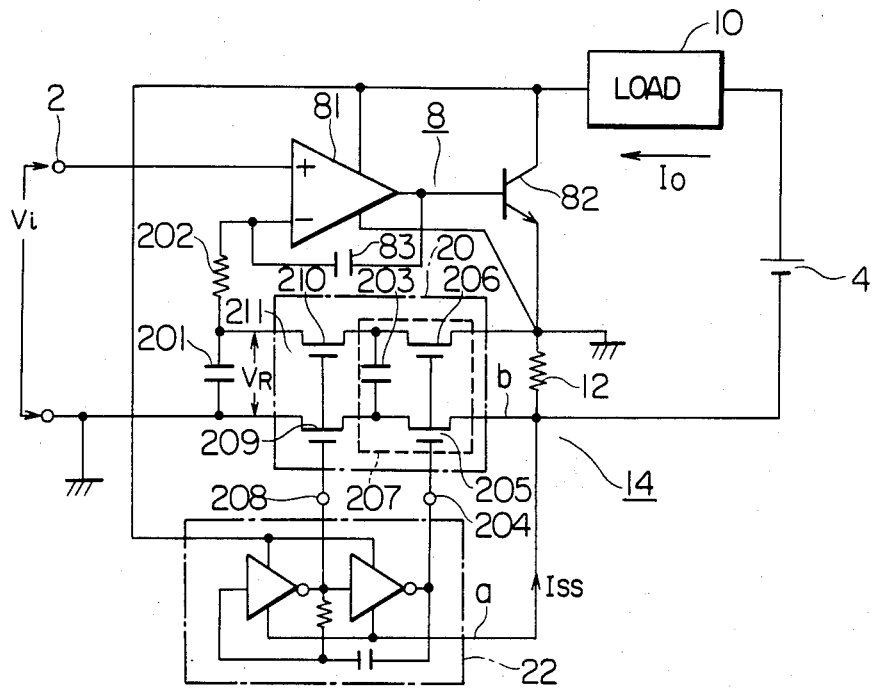
FIG. 4 is a circuit diagram of one embodiment of a voltage-to-current converter circuit according to the present invention.

FIG. 4 is a circuit diagram illustrating one embodiment of a voltage-to-current converter circuit according to the present invention. This voltage-to-current converter circuit is comprised of an amplifying circuit 8 capable of supplying to a load 10 a current corresponding to a difference between an input signal voltage $V_i$ and a feedback signal voltage $V_R$, and a feedback circuit 14 having a polarity inverting circuit 20 which detects the output current $I_0$ flowing the load 10 by means of a reference resistor 12 and samples and holds the detected voltage drop and outputs the held voltage as a feedback signal for the purpose of obtaining the voltage difference, thereby to supply to the load 10 an output current proportional to the input signal voltage $V_i$ as shown by the curve 100 in FIG. 1.

More in detail, in the amplifying circuit 8, the input signal $V_i$ is applied to the non-inverting terminal of an operational amplifier 81 functioning as an error amplifier, and one end of a feedback capacitor 83 and one end of a resistor 202 are connected to the inverting input terminal of the operational amplifier 81 to form an integration circuit, and the output of the operational amplifier 81 is connected to the base of a constant current output transistor 82, the positive power supply terminal of the operational amplifier 81 and the collector of the transistor 82 are connected to the positive pole of a power supply 4 via the load 10, and the negative power supply terminal of the operational amplifier 81 and the emitter of the output transistor 82 are connected to the negative pole of the power supply 4 via the reference resistor 12. Both ends of the reference resistor 12 are connected to the polarity inverting circuit 20, and the polarity inverting circuit 20 includes a hold circuit 207 (enclosed by the broken line) for sampling the voltage across the reference resistor 12 in response to a predetermined control signal as will be described hereinafter and for holding the sampled voltage in a capacitor 203, and includes an inverting switching circuit 211 (enclosed by the chain line other than the circuit 207) for inverting the polarity of the voltage held in the capacitor 203 when the difference between the input signal voltage $V_i$ and the feedback signal $V_R$ is to be obtained and for outputting the inverted voltage as the feedback signal $V_R$, and the feedback signal voltage $V_R$ outputted from the circuit 211 is supplied via a resistor 202 to the inverting input terminal of the operational amplifier 81 of the amplifying circuit 8. The hold circuit 207 includes switching elements 205 and 206 of FET or the like and the capacitor 203, and the switching elements 205 and 206 respectively connect the both ends of the reference resistor 12 to both ends of the capacitor 203. When the control signal is applied to the control electrode terminal 204 of the switching elements 205 and 206, these switching elements become conductive and the voltage across the reference resistor 12 is charged in the capacitor 203 and the voltage is held. The inverting switching circuit 211 includes switching elements 209 and 210 of FET or the like, and these switching elements are respectively connected to both ends of the capacitor 203. When another control signal is applied to the control electrode terminal 208 of the switching elements 209 and 210, these switching elements become conductive and the voltage held in the capacitor 203 is outputted from the polarity inverting circuit 20. The control signals respectively applied to the control electrode terminals 204 and 208 are generated in a pulse generator 22. The pulse generator 22 outputs two pulses having a phase difference of 180° from each other are supplied respectively to the terminals 204 and 208. Because of the need to cut off the switching elements of the polarity inverting circuit 20 without failure, the lower potential power supply terminal a of the pulse generator 22 should be connected to a lowest voltage point b of the polarity inverting circuit 20 or to a point whose potential is further lower. The pulse generator 22, in a preferred embodiment, is arranged as shown in FIG. 4 by an astable multivibrator having two CMOS (complementaly metal-oxide semiconductor) inverter gates connected in cascade, and the duty ratio of the output pulse is about 50%, and the frequency is between several kHz and several tens kHz. Furthermore, where the capacitors 83, 201 and 203 are formed by usual discrete components, it is preferable that the capacitance value thereof is 1000 pF or more to avoid the influence of a leaking current or noise current of the circuit. It would be better if the time constant of the resistor 202 and the capacitor 83 in the integration circuit is selected to be sufficiently longer as compared with the switching period of the polarity inverting circuit 20, that is, the pulse period of the pulse generator 22. Further, the reference resistor 12 is selected to have a resistance value of 250 Ω, if the feedback voltage of 5 V is to be obtained by the load current of 20 mA.

The operation of the voltage-to-current converter circuit will be described hereinafter. When the power supply 4 is turned on and the input voltage $V_i$ is applied between the input terminal 2 and ground, the astable multivibrator of the pulse generator 22 supplies the control pulses respectively to the terminals 204 and 208, and the amplifying circuit 8 causes the output current, i.e., the load current to flow. The load current flowing the reference resistor 12 produces the voltage drop therein. Since the voltage drop is more negative than the lowest power supply potential (ground) of the operational amplifier 81, the voltage signal having such potential can not be fed back as the feedback signal voltage into the operational amplifier. Then the voltage potential is inverted with respect to the polarity thereof. When the pulse of the control signal from the pulse generator 22 is applied to the control terminal 204 of the switching elements 205 and 206 of the polarity inverting circuit 20, the switching elements 205 and 206 become conductive and the drop voltage is charged in the capacitor 203. In this case, to the control terminal 208 of other switching elements 209 and 210, the control pulse of the inverse phase with respect to the pulse applied to the control terminal 204 is being applied, and hence the switching elements 209 and 210 are shut off. Then, the control pulse of the inverse phase with respect to that applied during the conduction is applied to the control terminal 204 and the switching elements 205 and 206 are shut off, and at the same time the switching elements 209 and 210 are rendered conductive. And the voltage charged in the capacitor 203 is outputted as the feedback signal voltage $V_R$ from the polarity inverting circuit 20 through the switching elements 209 and 210. At this time, the voltage $V_R$ is in the positive potential side with respect to ground potential as shown in FIG. 4, and hence the polarity of the drop voltage in the reference resistor 12 has been inverted. This operation is repeated at the frequency of the control signal pulse from the pulse generator 22. At a time immediately after the turning on of the power supply 4, since the output current of the transistor 82 has not sufficiently risen, the magnitude of the feedback signal voltage is small, and hence the non-inverting input of the operational amplifier 81 is larger than the inverting input. For this reason, the output voltage of the operational amplifier 81 increases in the positive direction and the base voltage of the output transistor 82 is forwardly biased to a great extent. Due to this bias, the output transistor 82 permits a current to flow through the load 10. The current flowing the load 10 is converted to a voltage by the reference resistor 12, and the voltage is held in the polarity inverting circuit 20, and then applied to the inverting input of the operational amplifier 81 after inversion of the polarity of the voltage. As a result, the negative input voltage of the operational amplifier 81 is raised. This operation is repeated, and the output current $I_0$ (load current) is stabilized at a constant value when the feedback signal voltage $V_R$ becomes equal to the input voltage $V_i$. The time required to reach the stationary state is proportional to the time constant (the product of the resistance of the resistor 202 and the capacitance of the capacitor 83) of the integration circuit (operational amplifier 81, capacitor 83, resistor 202). In the stationary state, no current flows through the integration resistor 202, and the magnitude of the voltage of the capacitor 201 and the magnitude of the terminal voltage of the capacitor 203 are equal to the terminal voltage of the reference resistor 12.

In this case, the output current $I_0$ is expressed by the equation:

$$I_0 = \frac{V_1}{R_0} + I_{ss} \quad (3)$$

where $V_i$ is the input voltage, $I_o$ is the output current, $R_0$ is the resistance of the reference resistor 12, and $I_{ss}$ is the power supply current of the CMOS pulse generating circuit 22, and this current flows through the lowest potential point a.

The amount of the current $I_{ss}$ is proportional to the operating frequency of the pulse generating circuit 22. However, since the pulse generating circuit 22 is formed by a CMOS inverter circuit, the current $I_{ss}$ can be made very small as compared with the operating current, etc. (in the order of mA) of the operational amplifier, for example, 1-2 $\mu A$ at about 10 kHz and hence negligible. For this reason, in the embodiment, the relationship between the input voltage $V_i$ and the output current $I_0$ is essentially determined only by a single resistor $R_0$, and thus the precision is improved. Furthermore, even when the input offset voltage of the operational amplifier 81 exists, the difference voltage can be obtained directly without using the resistor voltage divider circuit as in the prior art, and thus the precision is improved. In addition, since only one precision resistor for which the precision and stability are required is needed for the reference resistor 12, the reduction of the costs can be achieved.

Figure 5:
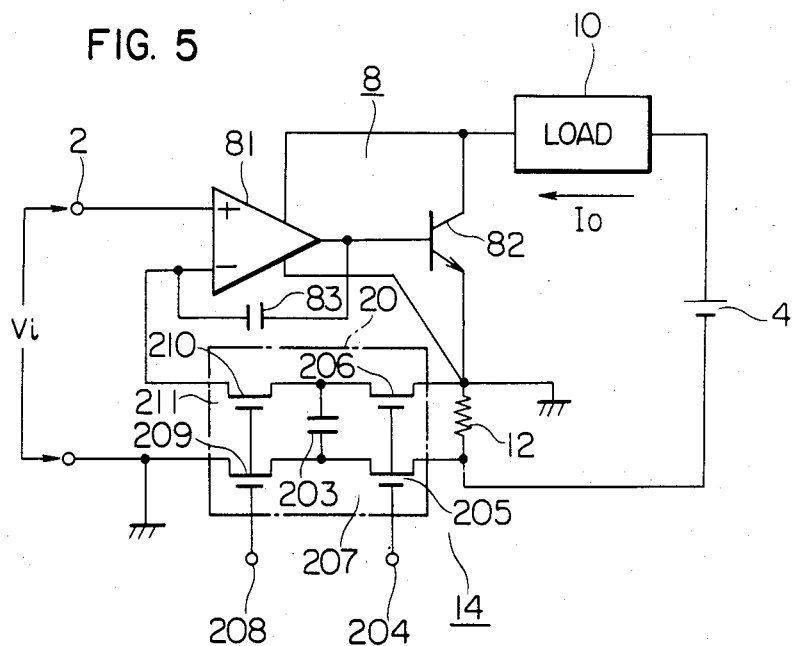
FIG. 5 is a circuit diagram of another embodiment of a voltage-to-current converter circuit according to the present invention.

FIG. 5 is a circuit diagram of another embodiment of a voltage-to-current converter circuit according to the present invention. In the arrangement of FIG. 5, a transistor 82 for output current control, a reference resistor 12 for current detection, and a polarity inverting circuit 20 are the same as in FIG. 4, and the arrangement of FIG. 5 differs from that of FIG. 4 in the omission of the capacitor 201 and the resistor 202. In this embodiment, upon application of an input signal $V_i$ to the non-inverting input terminal of an operational amplifier 81, the base of the transistor 82 is biased forwardly to permit a current to flow a load 10. This current is converted to a voltage by the reference resistor 12, and the voltage is applied to the inverting input terminal of the operational amplifier 81 after inversion to a positive voltage by a capacitor 203 of the polarity inverting circuit 20, and the output voltage of the operational amplifier 81 is lowered. Due to this feedback operation, a difference between the noninverting input and the inverting input of the operational amplifier 81 is diminished to zero, and both the inputs coincide. In other words, the voltage drop in the reference resistor 12 becomes equal to the input signal voltage $V_i$. In this voltage-to-current converter circuit, if the operating frequency of the polarity inverting circuit 20, i.e., the frequency of a pulse generating circuit 22 is sufficiently high, the feedback gain is proportional to the ratio of a capacitor 203 to a capacitor 83, i.e., a value of $C_{203}/C_{83}$. In this respect, the frequency mentioned above is, for example, 1-10 kHz. Since the capacitors 203 and 83 in FIG. 5 can be formed by MOS capacitors, the converter circuit of FIG. 5 can be formed to an integrated circuit with the exception of the precision resistor 12.

Figure 6:
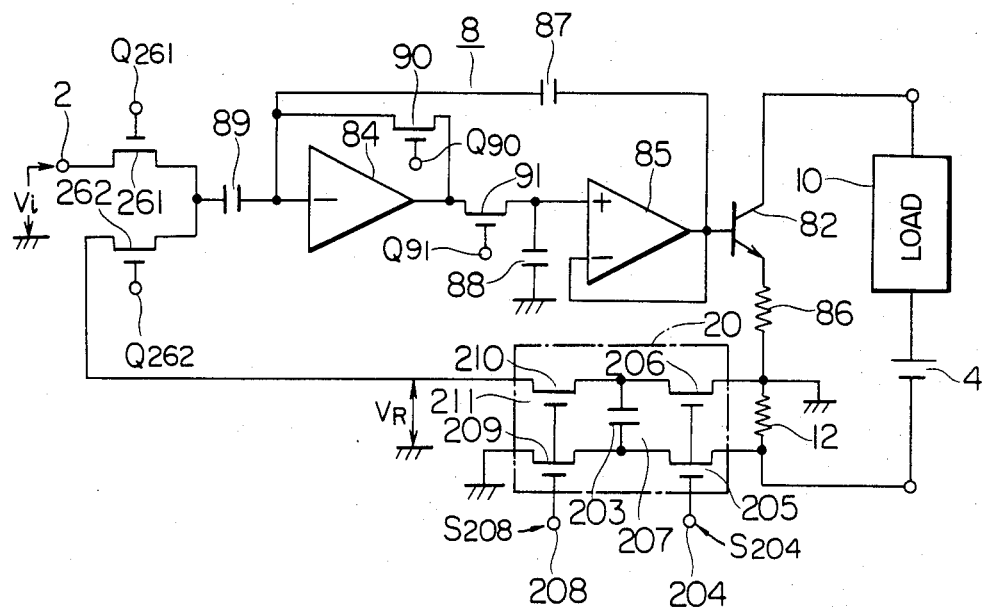
FIG. 6 is a circuit diagram of yet another embodiment of a voltage-to-current converter circuit according to the present invention.

FIG. 6 is a circuit diagram of further another embodiment of a voltage-to-current converter circuit according to the present invention. In the embodiment shown in FIG. 6, the differential amplifier described in the foregoing is made to operate as a sample hold type to eliminate the influence of the input off-set voltage of an operational amplifier 84 which amplifies a difference between the input signal voltage $V_i$ and the feedback signal voltage $V_R$, and the voltage-to-current conversion with high precision is made possible. The amplifying circuit 8 is comprised of operational amplifiers 84 and 85, an output transistor 82 and a resistor 85, capacitors 87, 88 and 89, and switching elements 90 and 91. To the inverting input terminal of the operational amplifier 84, the difference voltage is inputted via the capacitor 89. Between the input terminal and the output terminal of the operational amplifier 84, the switching element 90 is connected. The output terminal of the operational amplifier 84 is connected to the non-inverting input terminal of the operational amplifier 85 via the switching element 91. The non-inverting input terminal of the operational amplifier 85 is connected to ground via the capacitor 88. The inverting input terminal of the operational amplifier 85 is connected to its output terminal. The output terminal of the operational amplifier 85 is connected to the base of the output transistor 82, and is also connected to the inverting input terminal of the operational amplifier 84. The resistor 86 is connected between the emitter of the output transistor 82 and the reference resistor 12. Between the input terminal 2 to which the input voltage $V_i$ is applied and the capacitor 89, a switching element 261 is connected. The junction point between the switching element 261 and the capacitor 89 is supplied with the feedback signal $V_R$ through the switching element 262 from the inverting circuit 20.

Figure 7:
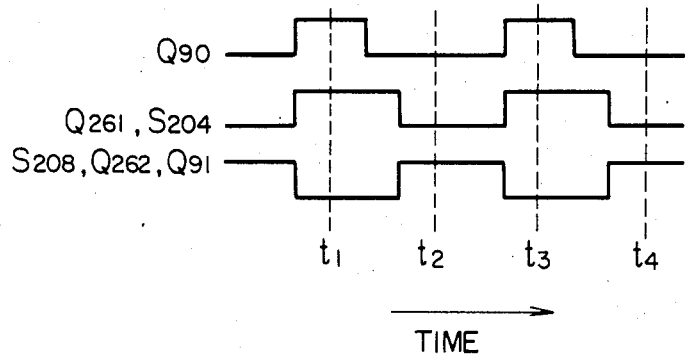
FIG. 7 shows waveforms to explain the operation of the circuit shown in FIG. 6.

The operation of the voltage-to-current converter circuit will be described referring to the time chart shown in FIG. 7. In FIG. 7, time is shown along the abscissa, and on the ordinate, a control signal $Q_{90}$ of the switching element 90, a control signal $Q_{261}$ of the switching element 261 and a control signal $S_{204}$ applied to the terminal 204 of the inverting circuit 20, and a control signal $Q_{91}$ of the switching element 91, a control signal $Q_{262}$ of the switching element 262 and a control signal $S_{208}$ applied to the terminal 208, respectively in voltages, are shown.

In FIG. 7, at time point $t_1$, the switching elements 261 and 90 shown in FIG. 6 become conductive, and the switching elements 205 and 206 of the polarity inverting circuit 20 are also conductive. And other switching elements are shut off. Thus, the input signal $V_1$ applied to the input terminal 2 is also applied to the input side terminal of the capacitor 89, and on the other hand, the input offset voltage of the operational amplifier 84 is applied to the input side of the operational amplifier 84. Consequently, the capacitor 89 is charged with a difference voltage between the input voltage $V_i$ and the offset voltage of the operational amplifier 84. And the capacitor 203 of the polarity inverting circuit 20 is charged with the drop voltage across the reference resistor 12. Then at time point $t_2$, the switching elements 90, 261, 205 and 206 are shut off, and the switching elements 262, 91, 209 and 210 become conductive. As a result, the voltage charged in the capacitor 203 of the polarity inverting circuit 20, after the polarity of the voltage is inverted, is applied to the capacitor 89 through the switching element 262. In this case, if the voltage of the capacitor 203 is equal to the input voltage $V_i$, the output of the operational amplifier 84 does not change, however, if the voltage $V_R$ held in the capacitor 203 is larger or smaller than the input voltage $V_i$, it changes. In other words, when the voltage of the capacitor 203 is smaller than the input voltage $V_i$, the input voltage of the operational amplifier 84 reduces and the output voltage increases. Since the output of the operational amplifier 84 is fed back via the switching element 91, operational amplifier 85 and capacitor 87 to the input terminal of the operational amplifier 84, if the gain of the operational amplifier 84 is sufficiently large, then the input terminal voltage of the operational amplifier 84 becomes equal to the previous state, i.e., the state wherein the input signal $V_i$ is inputted at the time point $t_2$, and becomes balanced. At the same time, when the output voltage of the operational amplifier 84 rises from the low state to the balanced state, the output voltage of the operational amplifier 85 also rises thereby to raise the base voltage of the transistor 82 result in the increase of the output current. Where the hold voltage $V_R$ of the capacitor 203 is larger than the input voltage $V_i$, although the voltage and the current vary in reverse with respect to the case described above, the balance is achieved when the hold voltage $V_R$ and the input voltage $V_i$ become equal to each other in the same way as described above.

At the next time point $t_3$, the input signal $V_i$ is applied to the capacitor 89 again, and further at time point $t_4$, the hold voltage $V_R$ is inputted and compared with the input voltage $V_i$. Thereafter, this operations are repeated alternately, and at the stable state, the drop voltage in the reference resistor 12 coincide with a voltage value of the input signal $V_i$. In the embodiment of FIG. 6, as described above, since the difference voltage between the input signal and the feedback signal is detected by an amount of change in charging of the capacitor 89, there is the advantage that the influence of the offset voltage of the operational amplifier 84 can be eliminated. In addition, since the operational amplifier 85 is located in a closed loop, the influence of the offset can be omitted. Further, the gain of the comparison of the input signal and the feedback signal and the correction thereof, i.e., the sensitivity of the amplifying circuit 8 can be changed by the ratio between the capacitances of capacitors 87 and 89. However, even when the gain is small, since an integration control system is constituted by the capacitor 87, and since the amount of change (error) is always fed back with high loop-gain, there is the advantage that no steady state error is caused in the stationary state.

Figure 8:
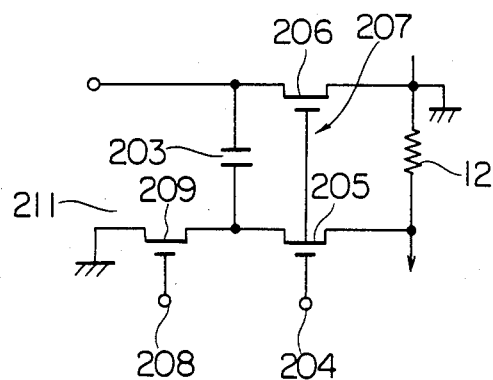
FIG. 8 is a circuit diagram of another embodiment of a polarity inverting circuit used in the voltage-to-current converter circuit of FIG. 6.

Furthermore, where the comparison of the voltages is performed in the sampling and comparison operation as in FIG. 6, the polarity inverting circuit 20 may be somewhat simplified. For example, in a circuit shown in FIG. 8, the inverting switching circuit 211 is comprised of only the switching element 209 by omitting the switching element 210. By using such a polarity inverting circuit 20, the same effects can be obtained as the polarity inverting circuit of FIG. 6.

Figure 9:
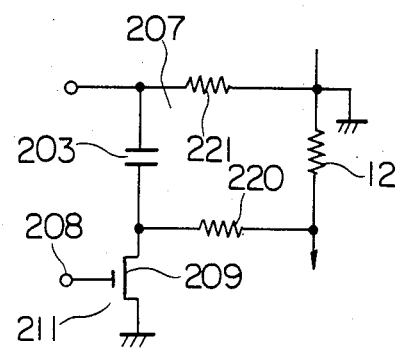
FIG. 9 is a circuit diagram of a variant of the polarity inverting circuit of FIG. 8.

In FIG. 9, the hold circuit 207 of FIG. 6 is modified by omitting the switching elements 205 and 206 and replacing by resistors 220 and 221, and further the inverting switching circuit 211 is comprised of only the switching element 209. Thus, in FIG. 9, the voltage across the reference resistor 12 is charged in the capacitor 203 through high resistance resistors 220 and 221. When the charged voltage of the capacitor 203 is desired to be read out, the switching element 209 is driven by a pulse signal to render the switching element 209 conductive and to connect one end of the capacitor 203 to ground. In the circuit shown in FIG. 9, if the on-resistance of the switching element 209 is several hundred ohms ($\Omega$), then the resistance value of the resistors 220 and 221 should be 1 M$\Omega$ or more.

Furthermore, other embodiments of the present invention include the following modifications.

(1) In place of the switching elements in the polarity inverting circuit 20, junction type field-effect transistors, bipolar transistors, relays or the like may be used.

Figure 10:
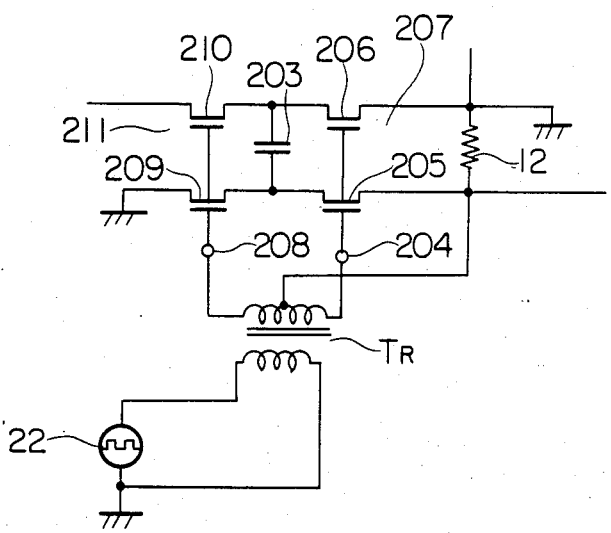
FIG. 10 is a circuit diagram of a variant of the polarity inverting circuit in which the control is performed through a transformer.

(2) To drive the polarity inverting circuit 20, as shown in FIG. 10, a driving signal from a driving signal source 22 may be applied to the switching elements 205, 206, 209 and 210 through a transformer $T_R$.

(3) By changing the constant current control loop to a self-excited oscillator system, the control pulse signal source in the polarity inverting circuit 20 may be omitted.

As described in the foregoings, in the present invention, a whole current flowing the load is detected by a reference resistor and is held, and the held voltage is made to be outputted as a feedback signal. Hence, there is the advantage in that the number of precision resistors which control the precision of the output current with respect to the input signal voltage can be reduced to one, and thus the low costs can be achieved. In addition, in the present invention, it is also advantageous in that the precision and stability can be improved. Further, in the present invention, the circuits can be easily integrated.

We claim:

1. A voltage-to-current converter circuit for supplying a current proportional to an input signal voltage to a load, comprising:
   an amplifying circuit receiving the input signal voltage and a feedback signal voltage to supply a current to said load corresponding to a difference between the input signal voltage and the feedback signal voltage;
   resistor means for being fed with said current flowing through said load;
   signal generating means for generating first and second control signals;
   sample-hold circuit means for sampling and holding a voltage across said resistor means in accordance with said first control signal, said sample-hold circuit means including a capacitor for being charged with said voltage, and first switching means responsive to said first control signal for connecting said capacitor and said resistor means in parallel with each other when said voltage is charged in said capacitor; and
   second switching means responsive to said second control signal for inverting a polarity of the held voltage by connecting said capacitor to said amplifying circuit after completion of the charging of said capacitor so that said charged voltage is inverted and inputted to said amplifying circuit as said feedback signal voltage.

2. A voltage-to-current converter circuit according to claim 1, wherein said signal generating means has a pulse signal generating circuit to output two pulses whose phases are different by 180° from each other, and wherein said sample-hold circuit means is responsive to either one of said two pulses and samples and holds the voltage, and said second switching means is responsive to the other one of said two pulses and inverts the polarity of said held voltage and outputs the feedback signal.

3. A voltage-to-current converter circuit according to claim 2, wherein said pulse signal generating circuit includes an astable multivibrator having two cascade connected inverter gates each being formed by a CMOS, and a lowest potential point of the power supply potential of said pulse signal generating circuit is connected to a lowest potential point of the power supply potential in said sample-hold circuit means or connected to a potential point lower than the lowest potential in said pulse signal generating circuit, and said pulse signal generating circuit and said sample-hold circuit means are connected to a common power supply.

4. A voltage-to-current converter circuit according to claim 2, wherein said pulse signal generating circuit includes a pulse generator, and a transformer having a primary side connected to said pulse generator and a secondary side provided with terminals to output said two pulses having phases different by 180° from each other, said two pulses being said first and second control signals.

5. A voltage-to-current converter circuit according to claim 1, wherein said second switching means feeds back the output thereof, which is the feedback signal voltage, directly to said amplifying circuit.

6. A voltage-to-current converter circuit according to claim 5, wherein said signal generating means has a pulse signal generating circuit to output two pulses whose phases are different by 180° from each other, and wherein said sample-hold circuit means is responsive to either one of said two pulses and samples and holds the voltage, and said second switching means is responsive to the other one of said two pulses and inverts the polarity of said held voltage and outputs the feedback signal.

7. A voltage-to-current converter circuit according to claim 6, wherein said pulse signal generating circuit includes an astable multivibrator having two cascade connected inverter gates each being formed by a CMOS, and a lowest potential point of the power supply potential of said pulse signal generating circuit is connected to a lowest potential point of the power supply potential in said sample-hold circuit means or connected to a potential point lower than the lowest potential in said pulse signal generating circuit, and said pulse signal generating circuit and said sample-hold circuit means are connected to a common power supply.

8. A voltage-to-current converter circuit according to claim 6, wherein said pulse signal generating circuit includes a pulse generator, and a transformer having a primary side connected to said pulse generator and a secondary side provided with terminals to output said two pulses having phases different by 180° from each other, said two pulses being said first and second control signals.

9. A voltage-to-current converter circuit according to claim 1, wherein said amplifying circuit includes an amplifier, third switching means, and another capacitor connected in series to the input of said amplifier, and wherein said third switching means switches said input signal voltage and said feedback signal voltage alternately to apply to said another capacitor, and said another capacitor is charged with a difference voltage between said input signal voltage and said feedback signal voltage, and said amplifier produces an output current corresponding to the charged voltage of another said capacitor.

10. A voltage-to-current converter circuit according to claim 9, wherein said signal generating means has a pulse signal generating circuit to output two pulses whose phases are different by 180° from each other, and wherein said sample-hold circuit means is responsive to either one of said two pulses and samples and holds the voltage, and said second switching means responsive to the other one of said two pulses and inverts the polarity of said held voltage and outputs the feedback signal.

11. A voltage-to-current converter circuit according to claim 10, wherein said pulse signal generating circuit includes an astable multivibrator having two cascade connected inverter gates each being formed by a CMOS, and a lowest potential point of the power supply potential of said pulse signal generating circuit is connected to a lowest potential point of the power supply potential in said sample-hold circuit means or connected to a potential point lower than the lowest potential in said pulse signal generating circuit, and said pulse signal generating circuit and said sample-hold circuit means are connected to a common power supply.

12. A voltage-to-current converter circuit according to claim 10, wherein said pulse signal generating circuit includes a pulse generator, and a transformer having a primary side connected to said pulse generator and a secondary side provided with terminals to output said two pulses having phase different by 180° from each other, said two pulses being said first and second control signals.

13. A voltage-to-current converter circuit for supplying a current proportional to an input signal voltage to a load, comprising:
an amplifying circuit receiving the input signal voltage and a feedback signal voltage to supply a current to said load corresponding to a difference between the input signal voltage and the feedback signal voltage;
first resistor means for being fed with said current flowing through said load;
hold circuit means for holding a voltage across said first resistor means, said hold circuit means including a capacitor for being charged with said voltage, and second resistor means for connecting said capacitor and said first resistor means in parallel with each other when said voltage is charged in said capacitor;
signal generating means for generating a control signal; and
switching means responsive to said control signal for inverting a polarity of the held voltage by connecting said capacitor to said amplifying circuit after completion of the charging of said cppacitor so that said charged voltage is inverted and inputted to said amplifying circuit as said feedback signal voltage.

* * * * *